United States Patent
Jenkins, IV

(10) Patent No.: US 7,193,439 B1
(45) Date of Patent: Mar. 20, 2007

(54) SEGMENTED CONFIGURATION OF PROGRAMMABLE LOGIC DEVICES

(75) Inventor: Jesse H. Jenkins, IV, Danville, CA (US)

(73) Assignee: Ilinx, Inc., San Jose, CA (US)

( * ) Notice: Subject to any disclaimer, the term of this patent is extended or adjusted under 35 U.S.C. 154(b) by 117 days.

(21) Appl. No.: 11/048,376

(22) Filed: Feb. 1, 2005

(51) Int. Cl.
*H03K 19/177* (2006.01)
(52) U.S. Cl. .......................................... 326/41; 326/38
(58) Field of Classification Search ............ 326/37–41, 326/46
See application file for complete search history.

(56) References Cited

U.S. PATENT DOCUMENTS

| | | | | |
|---|---|---|---|---|
| 5,654,650 A | * | 8/1997 | Gissel | 326/38 |
| 6,091,263 A | * | 7/2000 | New et al. | 326/40 |
| 6,150,839 A | * | 11/2000 | New et al. | 326/40 |
| 6,507,213 B1 | * | 1/2003 | Dangat | 326/38 |

* cited by examiner

*Primary Examiner*—Don Le
(74) *Attorney, Agent, or Firm*—LeRoy D. Maunu

(57) ABSTRACT

A programmable logic device (PLD) includes a plurality of segments, a plurality of segment-enable registers, and a configuration controller. Each segment-enable register is arranged to be set to a first value in response to resetting of the PLD. Each segment includes configurable logic that is associated with a respective segment-enable register. In addition, each segment is arranged to enable the configurable logic in response to a second value for the associated segment-enable register. The configuration controller is adapted to program the respective configurable logic in each segment to perform a respective function based on configuration data and to set each segment-enable register to the second value.

21 Claims, 4 Drawing Sheets

SEGMENTED CONFIGURATION OF PROGRAMMABLE LOGIC DEVICES

FIELD OF THE INVENTION

The present invention generally relates to programming programmable logic devices (PLDs) with configuration data.

BACKGROUND

Programmable logic devices (PLDs) may be configured to perform a variety of functions. A PLD may be programmed with configuration data to configure the logic and routing resources of the PLD to perform a selected function. In certain PLDs, following each power-up of the power supply, a programming time interval is required to load the configuration data into the logic and routing resources of the PLD. The PLD is not ready to perform the configured function until the completion of the programming time interval.

The flexibility of PLDs has lead to widespread use in the electronics industry. However, the programming time interval of a PLD may limit the usage of the PLD in certain applications. For example, a low power application may power-down devices between tasks to conserve power and thereafter require immediate processing when a new task becomes available. However, a PLD may be unsuitable as a device in a low power application if the programming time interval is greater than the required power-up response time of an application.

The present invention may address one or more of the above issues.

SUMMARY OF THE INVENTION

In accordance with one embodiment of the invention, a programmable logic device (PLD) includes a plurality of segments, a plurality of segment-enable registers, and a configuration controller. Each segment-enable register is arranged to be set to a first value in response to resetting of the PLD. Each segment includes configurable logic that is associated with a respective segment-enable register. In addition, each segment is arranged to enable the configurable logic in response to a second value for the associated segment-enable register, with the associated segment-enable register being coupled to the configurable logic in the segment. The configuration controller is coupled to the configurable logic in the plurality of segments and to the plurality of segment-enable registers. The configuration controller is adapted to program the respective configurable logic in each segment to perform a respective function based on configuration data and to set each segment-enable register to the second value.

In accordance with another embodiment of the invention, a method for configuring PLD includes programming a plurality of segment-enable registers in the PLD to one of a first and a second values. The method further includes programming respective configurable logic in each of a plurality of segments of the PLD to perform a respective function, with each segment associated with a respective segment-enable register, and enabling the respective configurable logic in each segment in response to the second value for the segment-enable register that is associated with the segment.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which.

DETAILED DESCRIPTION

In one embodiment of the invention, the configurable logic and routing resources of a field programmable gate array (FPGA) are partitioned into segments, each having an associated segment enable. Each segment enable may be programmed from configuration data to either enable the segment in response to completing the programming of the associated segment from the configuration data, or enable the segment in response to completing the programming of the FPGA from the configuration data, including completing the programming of all segments. The number of segments is generally more than one with an upper limit imposed by the number of available configurable FPGA resources on a chip and application-specific considerations related to the number of configurable resources per segment that may be required.

Figure 1:
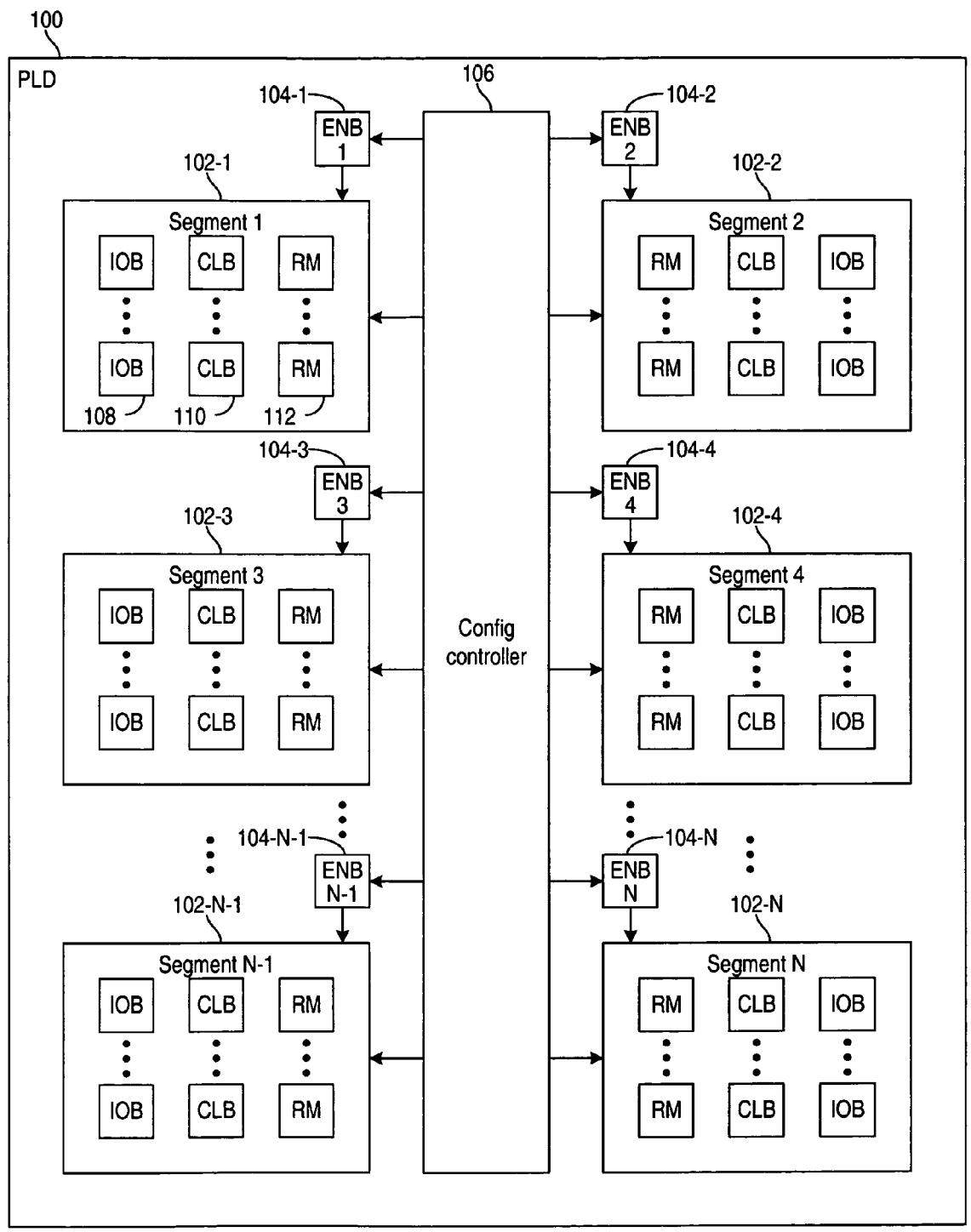
FIG. 1 is a block diagram of a PLD including configurable logic segments and configurable segment enables, according to various embodiments of the invention.

FIG. 1 is a block diagram of a PLD 100 including configurable logic segments 102-1 through 102-N and configurable segment enable blocks 104-1 through 104-N, according to various embodiments of the invention. The configurable logic of PLD 100 is partitioned into segments 102-1 through 102-N, each having a respective segment enable block 104-1 through 104-N.

Configuration data is used to program the PLD 100 to perform a selected function. Based on the configuration data, configuration controller 106 controls the programming of the configurable logic in each segment 102-1 through 102-N and the segment enable blocks 104-1 through 104-N. The configurable logic in each segment 102-1 through 102-N may include configurable input/output blocks (IOBs) 108, configurable logic blocks (CLBs) 110, and configurable routing matrices (RMs) 112.

On power-up of the PLD 100, the configurable logic 108, 110, and 112 in each segment 102-1 through 102-N and the segment enable blocks 104-1 through 104-N may be reset to a default state. The default state for the segment enable blocks 104-1 through 1-4-N may be a disable value. A disable value for a segment enable block, such as segment enable block 104-1, may disable the function of the corresponding segment, such as segment 102-1. For example, the disable value for segment enable block 104-1 may place the drivers of external pins of PLD 100 into a high-impedance state for the external pins driven by each IOB 108 of segment 102-1. In addition, the disable value for segment enable block 104-1 may cause the outputs of segment 102-1 that are internal to PLD 100 to be driven to a default value, such as a value of logic zero.

During programming of the configurable logic 108, 110, and 112 in a segment, such as segment 102-1, the corresponding segment enable block, such as segment enable block 104-1, generally retains the disable value, causing the function of the segment to remain disabled. After completing programming of the segment, the configuration controller 106 may set an enable value in the segment enable block. Depending on the selected function of the PLD 100, each segment enable block 104-1 through 104-N may be immediately enabled in response to completing the programming of the corresponding segment 102-1 through 102-N, or enabled at a time subsequent to completing the programming of the corresponding segment, such as in response to completing the programming of all segments 102-1 through 102-N.

A non-segmented PLD does not enable the function of the PLD until after programming all the configurable logic of PLD. In a segmented PLD, a segment may be enabled before completing the programming of the remaining segments of the PLD, and the segment is said to be enabled "early."

A user of a PLD 100 may indicate the segments that should be enabled early. In one example, a hardware description of the selected function is used to generate the configuration data, and the hardware description may associate portions of the hardware description with segments and indicate the segments that should be enabled early. In another example, a hardware description may indicate functions that should be enabled early, and these functions are mapped to one or more segments that are specified to be enabled early. Generally, configuration data generated for PLD 100 includes a specification of the enable timing for each segment enable block 104-1 through 104-N.

Figure 2:
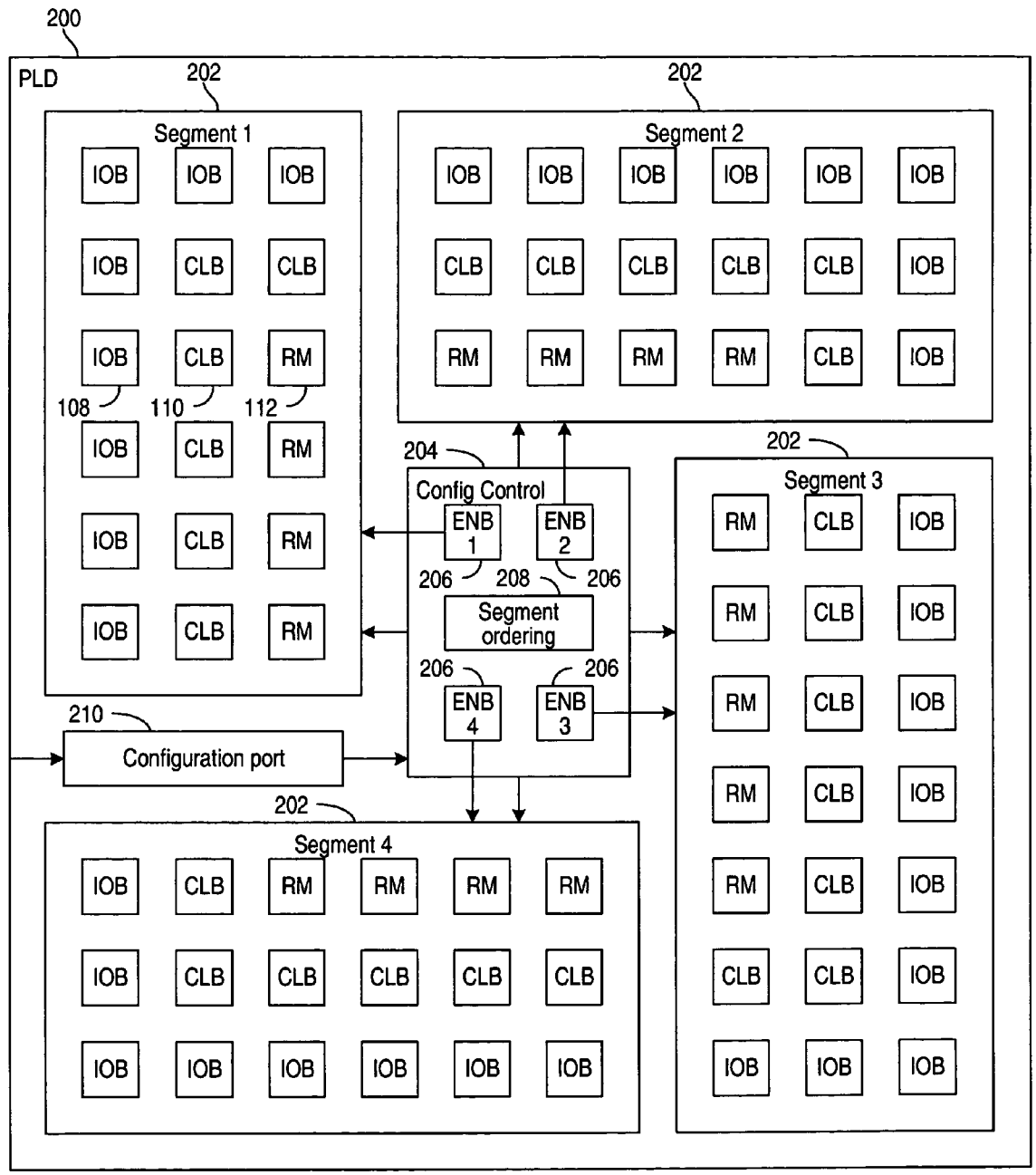
FIG. 2 is a block diagram of a PLD including configurable logic segments and a configuration controller having configurable segment enables and a configurable sequence in which segments may be configured, according to various embodiments of the invention.

FIG. 2 is a block diagram of a PLD 200 including configurable logic segments 202 and a configuration controller 204 having configurable segment enable blocks 206 and a configurable segment ordering 208, according to various embodiments of the invention.

The configuration controller 204 may receive configuration data from an external source via configuration port 210. The configuration data may be used by the configuration controller 204 to program the configurable logic 108, 110, and 112 in each of the segments 202, the configurable segment enable blocks 206, and the segment ordering 208.

In one embodiment, each segment enable block 206 includes a register that may be programmed to a disable value or an enable value from configuration data provided by the configuration controller 204. Each register may be initialized to the disable value on reset of PLD 200, causing the segment 202 and the configurable logic 108, 110, and 112 in the segment 202 to be disabled until the configuration controller 204 programs the register with the enable value. In another embodiment, each segment enable block 206 includes masking logic that receives an input from a register and an input from the configuration controller 204 that indicates programming of the associated segment 202 is complete. The register may be programmed to a disable value or an enable value by the configuration controller 204 to control whether completion of programming of a segment 202 causes the segment 202 to be enabled. In various embodiments, each segment enable block 206 may also include override logic that may cause all segments 202 to be enabled when the configuration controller 204 has completed the programming of every segment 202.

In one embodiment, the configuration data provides values for the segment enable blocks 206 and the segment ordering 208 before providing programming data for the configurable logic 108, 110, and 112 of the segments 202. The segment enable blocks 206 and the segment ordering 208 may each be included within the configuration controller 204, and the configuration data may program the configuration controller 204 before programming the configurable logic 108, 110, and 112 of the segments 202. The segment ordering 208 specifies the order for programming the segments. The programming data for the segments 202 may be sequentially arranged in data blocks in the configuration data. As the data blocks are sequentially received via the configuration port 210 by the configuration controller 204, the data blocks are directed to the segments 202 in the order given by the segment ordering 208.

The configuration controller 204 tracks the completion of the programming of each segment 202. Upon completing the configuration of a segment 202, the segment is enabled when the corresponding segment enable block 206 has the enable value. In one embodiment, the segment enable block 206 may be set with the default disable value to delay enabling of the corresponding segment 202 until completing the configuration of all of the segments 202.

The segments 202 may be associated with a physical partitioning of the configurable logic 108, 110, and 112 of the PLD 200. For example, a PLD may have four segments, each associated with a quarter of the configurable logic 108, 110, and 112 along one edge of the PLD. For another example, the PLD may be bisected horizontally and vertically giving four quadrants each associated with one of four segments. It will be appreciated that a PLD may have more than four or less than four segments. A PLD may have two segments, each associated with two edges, in an alternative example.

In one embodiment, the segment ordering 208 may be configurable to specify each of the segments 202 in addition to specifying the order of the segments 202. For example, each configurable logic block 108, 110, and 112 may each have an identifier, and the segment ordering 208 may include a configurable list of the identifiers of the segments 202.

Figure 3:
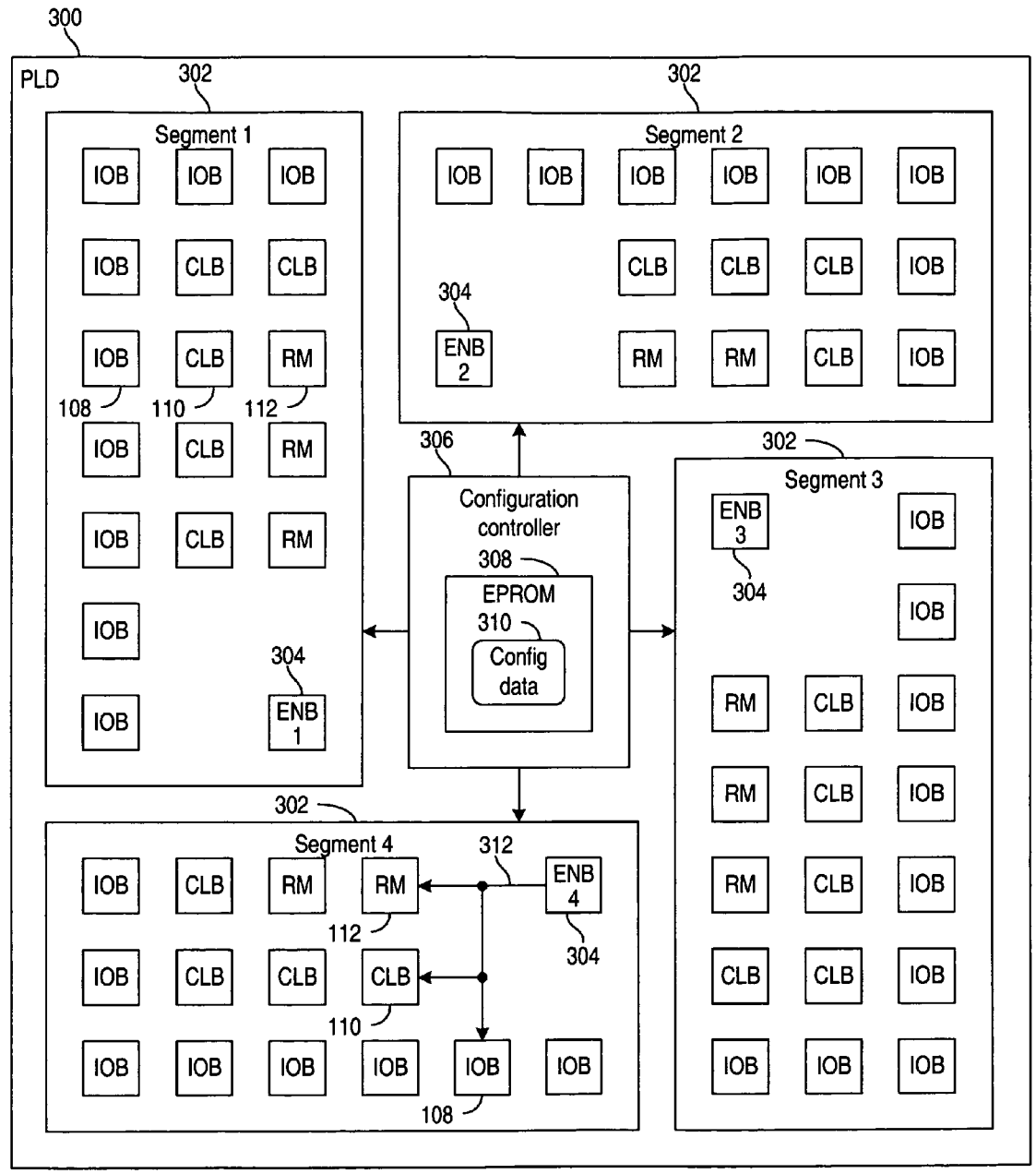
FIG. 3 is a block diagram of a PLD including configurable logic segments having respective enables, according to various embodiments of the invention.

FIG. 3 is a block diagram of a PLD 300 including configurable logic segments 302 having respective enable blocks 304, according to various embodiments of the invention. The configuration controller 306 may be connected to a flash EPROM 308 or other non-volatile memory that contains the configuration data 310 used to program the segment enable blocks 304 and the configurable logic 108, 110, and 112.

The configuration controller 306 may program the segments 302 by transferring the configuration data 310 from the non-volatile memory 308 to the segment enable blocks 304 and the programmable logic 108, 110, and 112. The configuration controller 306 may program the segments 302 in response to events, such as PLD 300 power-up or PLD 300 reset.

In one embodiment, the configuration data 310 includes addressing information in addition to data values used to program the segment enable blocks 304 and the configurable logic 108, 110, and 112. The addressing information may specify a particular segment 302 and/or block 108, 110, 112, and 304 to receive the associated data values.

An example application may have a logic function that needs to be enabled quickly following power-up of the PLD 300. The logic function may be restricted to certain segments 302, and programming data for the configurable logic 108, 110, 112 associated with the logic function may be included along with appropriate addressing information at the beginning of the configuration data 310. The configuration data 310 may include addressing information and data to enable the segment enable blocks 304 of the certain segments 302 for the logic function following the programming data for the logic function.

The configuration controller 306 may read the configuration data 310 from non-volatile memory 308 and transfer the configuration data 310 to the segments 302 starting from the beginning of the configuration data 310. Thus, the configurable logic 108, 110, and 112 for the certain segments 302 for the logic function are programmed from the configuration data 308 and then the enable blocks 304 are enabled for the certain segments, allowing the logic function to be enabled quickly following power-up of the PLD 300. Each segment enable block 304 may be coupled on line 312 to the configurable logic 108, 110, and 112 to permit the segment enable block 304 to enable the configurable logic 108, 110, and 112.

Subsequent to the enabling of the certain segments 302 for the logic function, the configurable logic 108, 110, 112 of the remaining segments 302 may be programmed. The segment enable blocks 304 for these remaining segments 302 may remain configured with the default disable value, or may be programmed from the configuration data 310 with a disable value. A segment 302 with a disable value for the segment enable block 304 is not enabled until the configuration controller 306 determines that all segments 302 are programmed.

In one embodiment, certain ones of segments 302 may be configured early with configuration data from the EPROM 310, while the remaining segments are later configured using a configuration port (not shown).

Figure 4:
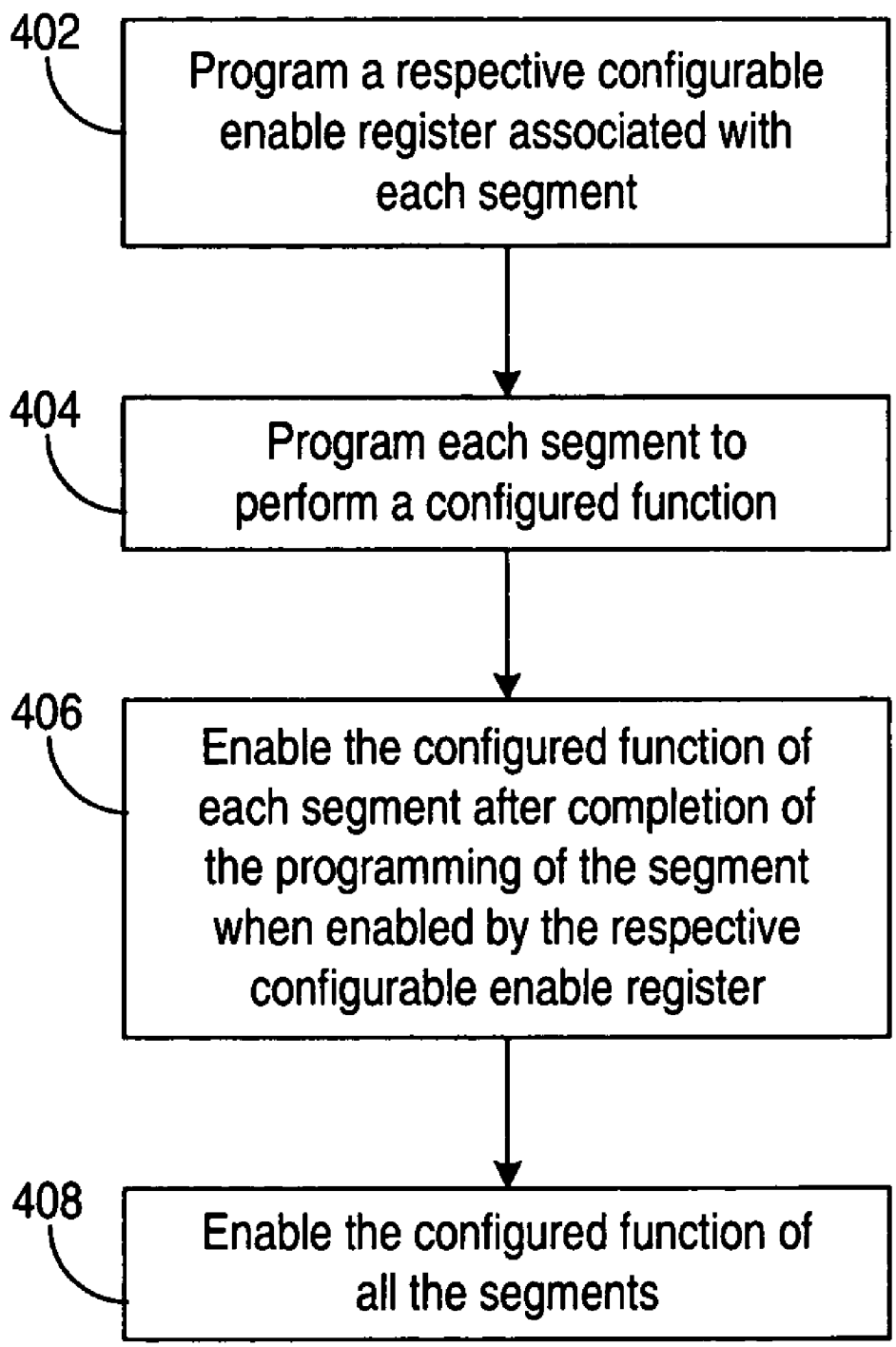
FIG. 4 is a flow diagram of a process for configuring and enabling the segments of configurable logic for a PLD, according to various embodiments of the invention.

FIG. 4 is a flow diagram of a process for configuring and enabling the segments of configurable logic for a PLD, according to various embodiments of the invention.

At step 402, the segment enable registers of the PLD are programmed to control the enabling of the associated segments. Each segment has an associated configurable enable register that may be programmed from the configuration data used to program the function of the PLD. The programmed value of a segment enable register may enable the programmed function of the associated segment either on completing the programming of the associated segment or delay the enabling of the programmed function of the associated segment until the completion of the programming of all the segments in the PLD.

In one embodiment, the programmed function of a segment is enabled by programming an enable value in the associated segment enable register. The enable value may be programmed subsequent to or simultaneous with completion of programming the segment. In another embodiment, the programmed function of a segment is enabled by the combination of programming an enable value for the associated segment enable register and determining that the programming of the segment is complete, with the enable value programmed prior to programming the segment.

At step 404, the segments of the PLD are sequentially programmed to perform a respective function by loading configuration data into the segments. At step 406, the configured function of each segment is enabled upon completing the programming of the segment for each segment so enabled by the associated segment enable register. At step 408, the configured function of all segments are enabled, including segments with associated segment enable registers that are programmed to delay the enabling of the programmed function. Typically, all segments are enabled in response to completing the programming of all segments regardless of the values of the segment enable registers.

Various embodiments of the present invention are described in terms of a segment enables for a segmented FPGA. Those skilled in the art will appreciate, however, that the invention could be implemented in different FPGA architectures, other types of programmable logic devices (PLDs) other than FPGAs, integrated circuits that include programmable logic circuitry and/or adapted to various application requirements, based on both volatile and non-volatile technologies.

It will be appreciated that PLDs having different layouts of CLBs, IOBs, and interconnect circuitry (and the functional equivalents thereof) may also implement the various embodiments of the invention described herein.

The present invention is thought to be applicable to a variety of systems for programming a PLD with configuration data and particularly applicable and beneficial in programming a segmented FPGA with configuration data. Other aspects and embodiments of the present invention will be apparent to those skilled in the art from consideration of the specification and practice of the invention disclosed herein. For example, a segment of a segmented FPGA may be partially programmed and then enabled by programming an enable value for the associated segment enable, with programming of the segment completed while the segment is enabled. It is intended that the specification and illustrated embodiments be considered as examples only, with a true scope and spirit of the invention being indicated by the following claims.

What is claimed is:

1. A programmable logic device (PLD), comprising:
a plurality of segment-enable registers, each segment-enable register arranged to be set to a first segment-enable value responsive to resetting of the PLD;
a plurality of segments, each segment including respective configurable logic, associated with a respective segment-enable register, and arranged to enable the respective configurable logic responsive to a second segment-enable value in the associated segment-enable register, wherein the associated segment-enable register is coupled to the respective configurable logic in the segment;
a configuration controller coupled to the configurable logic in the plurality of segments and to the plurality of segment-enable registers, the configuration controller adapted to program the respective configurable logic in each segment to perform a respective function based on configuration data and set each segment-enable register to the second segment-enable value; and
a set of respective input/output pads associated with each segment, wherein the set input/output pads associated with a segment is enabled responsive to the second segment-enable value in the associated segment-enable register.

2. The PLD of claim 1, further comprising a configuration port coupled to the configuration controller, the configuration port adapted to receive the configuration data from a source external to the PLD.

3. The PLD of claim 1, further comprising a non-volatile memory coupled to the configuration controller and arranged to store the configuration data.

4. The PLD of claim 3, further comprising a configuration port coupled to the non-volatile memory and adapted to receive the configuration data from a source external to the PLD and write the configuration data in the non-volatile memory.

5. The PLD of claim 1, wherein the configuration controller is further adapted to set each segment-enable register to the second segment-enable value not prior to the programming of the respective configurable logic in the segment associated with the segment-enable register.

6. The PLD of claim 1, wherein each segment is further arranged to enable the respective configurable logic responsive to the second segment-enable value in the respective segment-enable register and to completion of the programming of the respective configurable logic in the segment.

7. The PLD of claim 6, wherein the configuration controller is further adapted to set each segment-enable register to the second segment-enable value prior to the programming of the respective configurable logic in the segment associated with the segment-enable register.

8. The PLD of claim 1, wherein the plurality of segments includes four segments, each including approximately one fourth of the configurable logic of the PLD.

9. The PLD of claim 1, wherein the configuration controller is further adapted to program the configurable logic in the plurality of segments one segment at a time.

10. The PLD of claim 9, wherein the configuration controller is further adapted to set the segment-enable register to the second segment-enable value before commencing with the programming of the configurable logic in another one of the plurality of segments.

11. The PLD of claim 10, wherein the configuration controller is further adapted to program the configurable logic in the plurality of segments in a specified segment order.

12. The PLD of claim 11, further comprising at least one configurable-order register coupled to the configuration controller and adapted for storage of a value that controls the specified segment order.

13. The PLD of claim 11, wherein the configuration controller is adapted to set the segment-enable registers to the second segment-enable value in the specified segment order responsive to configuration data that provides the specified segment order.

14. The PLD of claim 1, wherein a function implemented in configurable logic of a first segment is enabled responsive to the second segment-enable value in the associated segment-enable register prior to completion of configuration of configurable logic of a second segment.

15. A method for configuring a programmable logic device (PLD), comprising:
programming a plurality of segment-enable registers in the PLD to one of a first and a second segment-enable value;
programming respective configurable logic in each of a plurality of segments of the PLD to perform a respective function, wherein each segment is associated with a respective segment-enable register;
enabling the respective configurable logic in each segment in response to the second segment-enable value in the segment-enable register associated with the segment; and
enabling a set of respective input/output Dads associated with each segment responsive to the second segment-enable value in the associated segment-enable register.

16. The method of claim 15 further comprising initializing the plurality of segment-enable registers to the first segment-enable value in response to reset of the PLD.

17. The method of claim 16, wherein the respective configurable logic in each segment is enabled in response to the second segment-enable value in the segment-enable register associated with the segment and to completion of the programming of the configurable logic in the segment.

18. The method of claim 16, wherein the respective configurable logic in each segment is enabled in response to completion of the programming of the configurable logic in the plurality of segments.

19. The method of claim 16, wherein the programming of the configurable logic in the plurality of segments further includes sequentially programming of the segments according to a specified order.

20. A programmable logic device (PLD), comprising:
means for programming a plurality of segment-enable registers to one of a first and a second segment-enable values;
means for programming respective configurable logic in each of a plurality of segments of the PLD to perform a respective function, wherein each segment is associated with a respective segment-enable register;
means for enabling the respective configurable logic in each segment in response to the second segment-enable value for the segment-enable register associated with the segment; and
enabling a set of respective input/output Dads associated with each segment responsive to the second segment-enable value in the associated segment-enable register.

21. The method of claim 15, further comprising enabling a function implemented in configurable logic of a first segment responsive to the second segment-enable value in the associated segment-enable register prior to completion of configuration of configurable logic of a second segment.

* * * * *

UNITED STATES PATENT AND TRADEMARK OFFICE
CERTIFICATE OF CORRECTION

PATENT NO. : 7,193,439 B1  
APPLICATION NO. : 11/048376  
DATED : March 20, 2007  
INVENTOR(S) : Jesse H. Jenkins, IV It is certified that error appears in the above-identified patent and that said Letters Patent is hereby corrected as shown below:

ON THE TITLE PAGE:  
Item (73): Assignee "Ilinix, Inc. San Jose, CA (US)" should read  
-- Xilinx, Inc., San Jose, CA (US) --.

Signed and Sealed this  
Tenth Day of April, 2012

David J. Kappos  
*Director of the United States Patent and Trademark Office*